United States Patent
Leung, Jr.

[11] Patent Number: 6,157,201
[45] Date of Patent: *Dec. 5, 2000

[54] BURN-IN SYSTEM FOR RELIABLE INTEGRATED CIRCUIT MANUFACTURING

[75] Inventor: Arthur T. Leung, Jr., Sunnyvale, Calif.

[73] Assignee: Sun Microsystems, Inc., Mountain View, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/015,027

[22] Filed: Jan. 28, 1998

Related U.S. Application Data

[62] Division of application No. 08/425,975, Apr. 20, 1995, Pat. No. 5,798,653.

[51] Int. Cl.[7] .................................................. G01R 35/00
[52] U.S. Cl. ............................................ 324/760; 324/765
[58] Field of Search .................................. 324/760, 754, 324/758, 765, 158.1, 73.1

[56] References Cited

U.S. PATENT DOCUMENTS

| | | | |
|---|---|---|---|
| 4,900,948 | 2/1990 | Hamilton | 307/149 |
| 4,918,385 | 4/1990 | Shreeve | 324/158 R |
| 4,926,117 | 5/1990 | Nevill | 324/760 |
| 4,945,302 | 7/1990 | Janum | 324/73.1 |
| 4,961,053 | 10/1990 | Krug | 324/537 |
| 4,968,931 | 11/1990 | Littlebury et al. | 324/760 |
| 4,978,914 | 12/1990 | Akimoto et al. | 324/158 |
| 5,003,156 | 3/1991 | Kilpatrick et al. | 219/209 |
| 5,047,711 | 9/1991 | Smith et al. | 324/158 R |
| 5,126,656 | 6/1992 | Jones | 324/760 |
| 5,164,661 | 11/1992 | Jones | 324/760 |
| 5,173,906 | 12/1992 | Dreibelbis et al. | 371/22.5 |
| 5,199,035 | 3/1993 | Lopez et al. | 371/68.1 |
| 5,204,618 | 4/1993 | Matsuoka | 324/158 R |
| 5,241,266 | 8/1993 | Ahmad et al. | 714/733 |
| 5,250,895 | 10/1993 | Harigai | 324/158 |
| 5,294,882 | 3/1994 | Tanaka | 324/158 R |
| 5,327,074 | 7/1994 | Ehiro | 324/158.1 |
| 5,341,096 | 8/1994 | Yamamura | 324/765 |
| 5,701,666 | 12/1997 | DeHaven et al. | 29/831 |
| 5,798,653 | 8/1998 | Leung, Jr. | 324/760 |
| 5,929,651 | 7/1999 | Leas et al. | 324/765 |

*Primary Examiner*—Safet Metjahic
*Assistant Examiner*—T. R. Sundaram
*Attorney, Agent, or Firm*—Blakely Sokoloff Taylor & Zafman

[57] ABSTRACT

A burn-in system for integrated circuits (ICs) generates thorough input stimuli from within the burn-in chamber. A very high node-toggle percentage within the IC being exercised is achieved, similar to that of a dynamic burn-in oven, even though the burn-in system of this invention has a cost and complexity similar to that of a static burn-in oven. This provides a cost-effective and reliable way to reduce the infant mortality of the ICs being exercised, or to estimate the longevity of the batch of ICs from which they came. The input-stimuli generator is based on a special-purpose burn-in controller IC. To better withstand the environmental stress within the burn-in chamber, the burn-in controller IC is fabricated using a robust IC technology, is operated at its nominal supply voltage and includes continuous fault tolerance features (such as self-test and/or voting). It is fully programmable to allow the same burn-in controller to be used with a variety of types of ICs being exercised. In accordance with another aspect of this invention, the input-stimuli generator loads instruction memory internal to the ICs being exercised with a self-exercise program and then waits while they execute this self-exercise program.

22 Claims, 7 Drawing Sheets

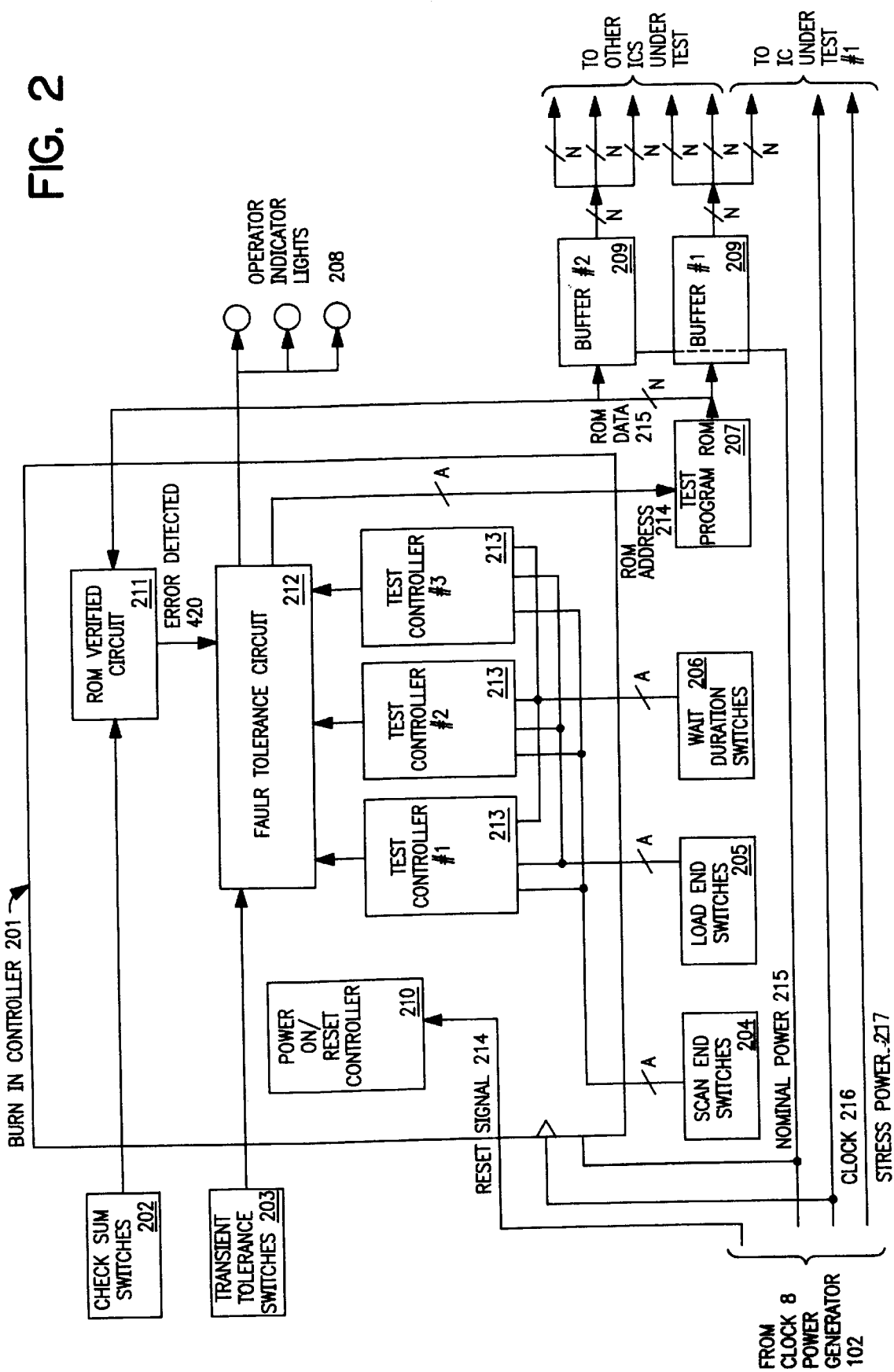

BURN-IN SYSTEM FOR RELIABLE INTEGRATED CIRCUIT MANUFACTURING

This is a divisional of application Ser. No. 08/425,975 filed on Apr. 20, 1995, now Pat. No. 5,798,653, issued Aug. 25, 1998.

FIELD OF THE INVENTION

This invention relates generally to testing and reliability enhancement of Integrated Circuits (ICs), and particularly of Very Large Scale Integration (VLSI) ICs. In particular, it relates to methods and apparatus for toggling a high percentage of the electrical nodes of an IC while being exercised in a burn-in oven.

BACKGROUND OF THE INVENTION

The complexity of today's ICs and of the processes used to fabricate them requires constant monitoring and quality assurance to ensure that the ICs fabricated work and will continue to work over their expected lifetime. Any IC fabrication process produces a percentage of ICs that do not function due to environmental contamination, flaws in materials, mask mis-alignment, etc. Any IC fabrication process also produces a percentage of ICs that initially do function properly, but fail after only a short period of operation. This is due to, for example a metal wire within the IC that is too irregular or too thin to repeatedly carry electrical current without damaging effects such as electron migration or localized heating. When such early failures occur during actual use of an IC in a system, they can be very expensive both in terms of user satisfaction and in terms of time and cost to replace the IC in the system.

One technique that is commonly used to reduce such "infant mortality" is to subject ICs to age-accelerating stress prior to assembling them into systems. This usually involves heat and operating voltages that are higher than normal, and may involve high humidity to stimulate corrosion. After a burn-in period of perhaps an hour, the ICs are tested. Any that no longer operate properly are discarded. Thus, if an IC is going to fail early, it is likely to be caught early and inexpensively.

The technique of subjecting ICs to age-accelerating stress can also be used to estimate the expected longevity of a batch of ICs. If a statistically significant sample of ICs from a particular manufacturing run or batch is subjected to age-accelerating stress for a longer period, perhaps 100 hours, then the longevity of the ICs in that batch can be estimated. If even a few percent of the sample no fail with aging, then the batch may be seriously flawed. Commercial ICs may be expected to have failure rates of less than several hundred failures per million ICs over a several-year lifetime.

One commonly used method of subjecting ICs to age-accelerating stress is to place the ICs within a static burn-in system. Such a system comprises: (1) a burn-in chamber that subjects its contents to carefully controlled heat and humidity; (2) circuit boards that hold the ICs within the chamber; (3) a power and clock generator, located outside the burn-in chamber, that produces power and clock signals for the ICs; and (4) wires and connectors that transfer the power and the clock signals from the power and clock generator to the circuit boards and then to the power and clock pins of the ICs. The ICs are usually powered at a stress voltage, i.e. one that is somewhat higher than normal. In a static burn-in oven, the input pins of the ICs are not given any input stimuli.

A significant problem with such a static burn-in system is that, in practice, few of the electrical circuit nodes of a complex IC toggle under these conditions, i.e. without the input pins toggling state as they would when the IC is actually operated. In order to accelerate aging of a Complementary Metal-Oxide Silicon (CMOS) IC, which is the most widely used technology for commercial ICs, it is necessary to have most or all of the circuit nodes within it toggle during the burn-in period. The transistors in a CMOS IC draw only a minimal leakage current when they are steadily on or steadily off, but draw significant current during each transition from on to off or visa versa. During the operating life of an IC, it is the current traveling through a transistor, a wire or other circuit element that is likely to destroy it.

Another prior-art approach of subjecting ICs to age-accelerating stress uses dynamic burn-in systems, which do stimulate the input pins of the ICs. A dynamic burn-in system includes the above-described components of a static burn-in system but adds: (1) an input-stimuli generator, located outside of the burn-in chamber, that generates input stimuli; and (2) wires and connectors that transfer the input stimuli from the external generator to the circuit boards and then to the input pins of the ICs being exercised. The input-stimuli generator produces a programmable input-stimuli sequence. Proper design of this input-stimuli sequence can guarantee that a high percentage of the electrical nodes within the IC toggle during burn-in.

Dynamic burn-in systems are commercially available, but at a substantial premium in price over static burn-in ovens. The input signals must travel along wires and connectors that are of significant length and that go through a temperature gradient. Inductive and capacitive effects within these wires and connectors can produce cross talk among signals and distorted input-stimuli wave forms at the input pins of the ICs being exercised. Further, the input stimuli generator must be able to drive an unusually large load of input pins because it is desirable to burn-in a batch of tens or even hundreds of ICs within the same burn-in chamber.

Engineering solutions are known that produce acceptable input-stimuli wave forms, but they require considerable complexity. Unfortunately, with complexity comes not only substantial additional costs to build such dynamic burn-in systems, but also numerous added points of potential failure. Very large costs can be incurred if a burn-in system fails part way through a one-hundred-hour burn-in run—the ICs being exercised may be of questionable value for meaningful measurements.

Thus there is a need for a cost-effective, simple and reliable way to exercise a high percentage of the nodes of ICs while subjecting them to age-accelerating stress.

SUMMARY OF THE INVENTION

The novel integrated circuit (IC) burn-in system of the present invention places an input-stimuli generator within a burn-in chamber. The input-stimuli generator exercises a high percentage of the nodes of the ICs, while they are subjected to age-accelerating environmental and supply-voltage stress. This provides a cost-effective and reliable way to reduce the infant mortality of the ICs being exercised, or to estimate the longevity of the batch of ICs from which they came. The input-stimuli generator is based on a special-purpose burn-in controller IC. To better withstand the environmental stress within the burn-in chamber, the burn-in controller IC is fabricated using a robust IC technology, is operated at its nominal supply voltage and includes continuous fault tolerance features (such as self-test and/or voting). It is fully programmable to allow the same burn-in controller to be used with a variety of types of ICs being exercised. In accordance with another aspect of this invention, the input-stimuli generator loads instruction memory internal to the ICs being exercised with a self-exercise program and then waits while they execute this self-exercise program.

BRIEF DESCRIPTION OF THE DRAWINGS

The present invention is illustrated by the following drawings, in which known circuits are shown in block-diagram form for clarity:

FIG. 2 shows the architecture of the input-stimuli generator, including the architecture of its burn-in controller.

The present invention should not be taken as being limited to the design alternatives or embodiments illustrated in these drawings and in the following textual description, which are for explanation and for aiding the reader's understanding.

DETAILED DESCRIPTION OF THE INVENTION

Overview

Figure 1:
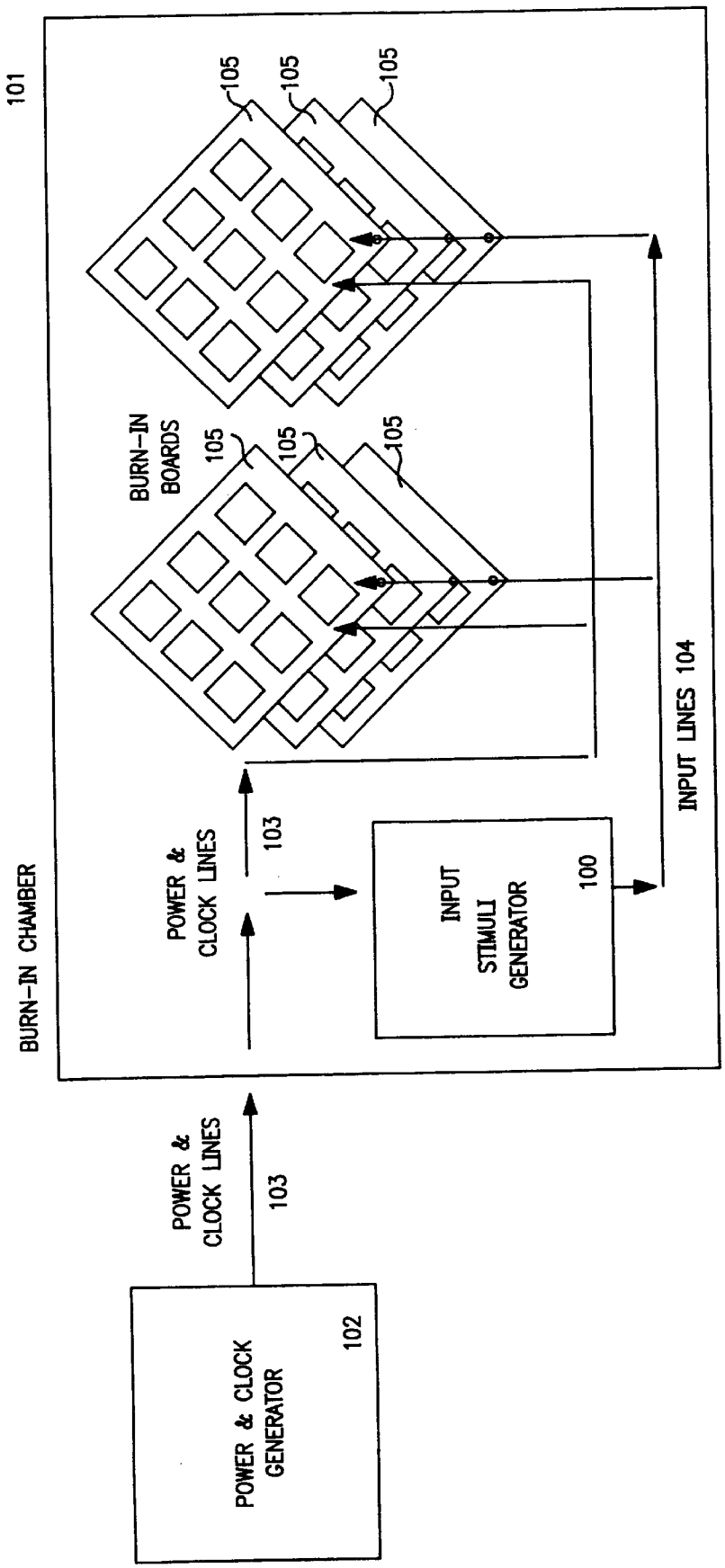
FIG. 1 shows the burn-in system of the present invention.

FIG. 1 shows the burn-in system of the present invention. Power & clock generator 102, located outside of burn-in chamber 101, supplies power and clock to the components within burn-in chamber 101: i.e. input-stimuli generator 100 and burn-in boards 105. Input-stimuli generator 100 drives a sequence of test-stimuli input to input lines 104, then to burn-in boards 105. The ICs being exercised receive power, clock and input stimuli from burn-in boards 105.

Locating input-stimuli generator 100 within burn-in chamber 101 provides substantial cost and complexity reduction in input lines 104, which must transmit high frequency signals from wherever the input stimuli are generated to burn-in boards 105. This invention substantially reduces the length of input lines 104 and eliminates the need for them to go through a temperature gradient. This reduces the inductive and capacitive effects that in the prior art produced cross talk among input-stimuli signals and distorted input-stimuli wave forms at the input pins of the ICs being exercised.

Although not shown in FIG. 1, input-stimuli generator 100 can be replicated as needed within burn-in chamber 101. For example, each burn-in board 105 could contain its own input-stimuli generator 100. This design alternative makes the input-stimuli lines completely local within each burn-in board 105 and substantially reduces the drive capability required from input-stimuli generator 100.

Architecture of the Input-Stimuli Generator

FIG. 2 shows the architecture of input-stimuli generator 100 of the present invention and its connections the rest of the burn-in system. Input-stimuli generator 100 comprises burn-in controller 201, checksum switches 202, transient-tolerance switches 203, scan-end switches 204, load-end switches 205, wait-duration switches 206, test program ROMs 207, operator indicator lights 208 and buffers 209.

Burn-in controller 201 is preferably implemented as an IC that is robust, i.e. one manufactured using a process technology that is better able to withstand temperature and any other environmental stresses within burn-in chamber 101 than the ICs being exercised. Preferably, one element of this robustness is that it has been fabricated with minimum feature sizes larger than that of the ICs being exercised. For example, the ICs being exercised may be fabricated using minimum feature sizes of 0.75 microns, while burn-in controller 201 may be fabricated using minimum feature sizes of 2.0 microns, for example, as a relatively small-complexity 2-micron gate array.

Checksum switches 202, transient-tolerance switches 203, scan-end switches 204, load-end switches 205, wait-duration switches 206 and test program ROMs 207 provide programmability. By altering these elements, any input stimuli pattern can be presented to the input pins of the IC being exercised, and if the ICs being exercised are properly designed virtually any pattern of internal node transitions can be induced.

Each of switches 202 to 206 is used to specify to burn-in controller 201 the current value of a programmability parameter. By replacing test program ROMs 207 and setting new values in switches 202 to 206, the burn-in system of the present invention can be customized to operate on ICs being exercised of virtually any design. The maximum length of the test or exercise run is limited only by the maximum address for test program ROMs 207 that is supported by burn-in controller 201.

It will be obvious to one skilled in the art that the programmability of the present invention can be achieved in various ways without departing from its spirit and scope. For example, the programmability parameter values could be read from specified locations within test program ROMs 207.

Operator indicator lights 208 provide to the operator looking within burn-in chamber 101 visible indicators of the current operation of the burn-in system, including important warnings of failure or potential failure. Operator indicator lights 208 could additionally or alternatively be implemented using lights or audible alarms external to burn-in chamber 101 without departing from the spirit and scope of the present invention.

Operator indicator lights 208 can also be used to indicate the progress of the test. For example, an array of 16 lights can provide a 16-bit indicator of the number of successful test runs completed. Preferably, the number of bits displayed in such an indicator and the significance of the bits displayed would be chosen such that the low order bits displayed would toggle every few seconds to provide to the operator a visual indicator that the burn-in system is progressing, while the high order bits would represent a large enough number that rollover would not occur during a long test run.

The input of buffers 209 comes from the output of test program ROMs 207. The outputs of each of buffers 209 is connected to a number of ICs being exercised. The number of buffers 209 that can be driven from test program ROMs 207, and the number of ICs being exercised that can be driven from a each of buffers 209 are selected based on the drive and load characteristics of the specific components used to implement these elements. Further, a tradeoff exists between putting more input-stimuli generators 100 within burn-in chamber 101 and thereby reducing the number of buffers 209 used within each input-stimuli generator 100, versus increasing the number of buffers 209 used within each input-stimuli generator 100. Further, depending on the technology used to implement burn-in controller 201, it may be possible to make buffers 209 internal to the same integrated circuit that implements burn-in controller 201. The advantages, disadvantages and tradeoffs of these design alternatives will be obvious to one skilled in the art.

Input-stimuli generator 100, specifically burn-in controller 201 and test program ROMs 207, receive clock 216 and nominal power 215 from power & clock generator 102. Nominal power 215 is also supplied to buffers 209. If buffers 209 were to be replaced in an alternative design with clocked latches, then clock 216 would be provided to such latches. So as to minimize aging effects on the components of input-stimuli generator 100, preferably the power supplied is within their nominal power specifications, and not at stress power voltages.

Clock 216 and stress power 217 are also provided from power & clock generator 102 to each IC being exercised. Stress power 217 is typically run at a higher voltage than the nominal specification of the ICs being exercised. For example, if they are specified to operate with a power supply at a voltage anywhere in the range of 4.5 to 5.0 volts, then stress power 217 might be provided at 5.2 volts.

Reset signal 214 is provided to input-stimuli generator 100 from power & clock generator 102. Alternatively or additionally, it could be provided by a switch located on the same printed-circuit board as input-stimuli generator 100.

The connections between power & clock generator 102 and input-stimuli generator 100 travel along power and clock lines 103. As described above, these connections include reset signal 214, nominal power 215, and clock 216.

Burn-In Controller

Also shown in FIG. 2 is the architecture of the burn-in controller of the present invention. Burn-in controller 201 comprises power-on/reset controller circuit 210, ROM verifier 211, fault tolerance circuit 212, and multiple copies of test controller 213.

Power-on/reset controller 210 responds to an initial application of nominal power 215 or to receiving a reset signal 214. When either of these events occur, power-on/reset controller 210 ensures that each element of burn-in controller 201 is reset and initialized to a predetermined and appropriate state.

Test controller 213 produces signals suitable to control the application of input stimuli to an IC being exercised. In a preferred embodiment, these control signals are used to address a test program ROM or ROMs in which the test or exercise stimuli are stored. Alternatively, test controller 213 could generate the test stimuli directly, e.g. by using an algorithm to generate a test pattern for a memory IC. Each test controller 213 reads scan-end switches 204, load-end switches 205 and wait-duration switches 206.

Multiple copies of test controller 213 in conjunction with fault tolerance circuit 212 make burn-in controller 201 fault tolerant. Fault tolerance circuit 212 compares the input-stimuli control signals generated by each test controller 213 and takes appropriate action if they are not identical. Fault tolerance circuit 212 may comprise a self-test circuit, a voting circuit or both. Fault tolerance circuit 212 provides ROM address 414 to test program ROMs 207. It also drives operator indicator lights 208.

A self-test circuit within fault tolerance circuit 212 compares the input-stimuli control signals generated by each test controller 213 to determine if all are functioning in the same manner. It generates error-detected signal if they are not.

A voting circuit within fault tolerance circuit 212 compares the input stimuli-control signals generated by each test controller 213 to determine the prevalent values or majority vote for each such signal. It then provides these prevalent values to control the input stimuli to the ICs being exercised. As long as a majority of the test controllers are operating correctly, then the input stimuli sequence presented to the ICs being exercised will not be affected by failure of one or more of the test controllers.

ROM verifier 211 operates to detect an error in the data being produced by test program ROMs 207. During the course of each test run, ROM verifier 211 generates a checksum-like function over the values of ROM data 415. The current checksum value and the current value of ROM data 415 are inputs to a checksum function, which could be a simple bit-by-bit parity or cyclic redundancy check (CRC) function, or a linear feedback shift register implementing an error-check polynomial, or any of the many error correction coding (ECC) functions known in the art. At the beginning of each test run the current checksum value is cleared to zero. At the end of each test run, error-detected signal 220 is generated if the current checksum value does not match the value set in checksum switches 202. As shown, ROM verifier 211 only checks the direct outputs of test program ROMs 207. If it is desired to test the functioning of buffers 209, the output of each of buffers 209 could be made available to a corresponding copy of ROM verifier 211. Alternatively, ROM verifier 211 could be omitted if possible failures of test program ROMs 207 were not a significant concern.

Test-Run Sequence

Figures 3A, 3B:
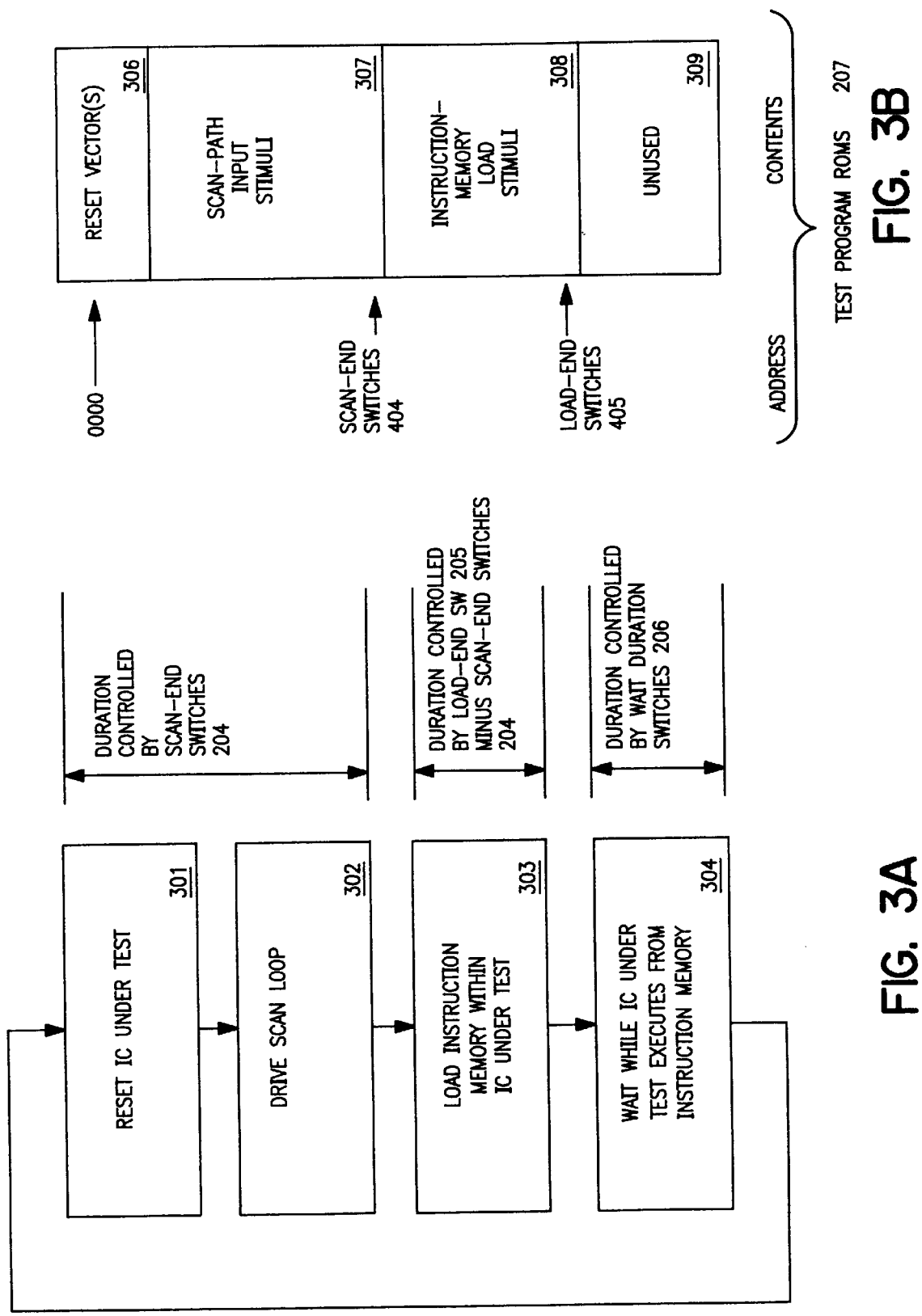
FIG. 3(a) shows the test or exercise sequence of input stimuli applied to input pins of the IC being exercised, and shows the programmability, via switches, of the sequence durations.
FIG. 3(b) shows the location of the input-stimuli words or test vectors within the test program ROMs.

FIG. 3(a) shows the test-run sequence used by the present invention. FIG. 3(b) shows the addressing or layout of the test stimuli words or vectors within test program ROMs 207. As shown in FIG. 3(a), at the start of each test run in Step 301 the ICs being exercised are reset to a known condition. This step corresponds to region 306 of test program ROMs 207, as shown in FIG. 3(b). Region 306 contains the stimuli values to be provided to input pins of the ICs being exercised to perform this reset function. Each N-bit word within test program ROMs 207 is a test vector, i.e. a set of N values to be simultaneously applied to N input pins of the ICs being exercised. The reset function is typically, but not necessarily, only one test vector long—that is, the IC being exercised typically can be reset in only one clock cycle.

In step 302, the scan loop internal to the IC being exercised is preferably driven from the input stimuli from region 307 of test program ROMs 207. The present invention assumes that the ICs being exercised have a scan loop that connects all or most of their internal state memory elements into a long shift register that can be read from or written into for test purposes. Scan loops are well-known in the art, and need not be designed any differently to be operable with the present invention. If a scan loop is not present in the IC being exercised, then step 302 can be used to provide other test stimuli to exercise the device under test, which presumably would be designed so as to be thoroughly exercisable without a scan loop.

The duration of step 301 plus 302 is set by the value in scan-end switches 204. Scan-end switches 204 point to the last location within region 307 of test program ROMs 207. When ROM address 214 equals the value set in scan-end switches 204, then burn-in controller 201 changes state and enters step 303.

In step 303, input-stimuli generator 100 preferably loads instruction memory within the IC being exercised with a self-exercise program sequence based on the instruction memory load stimuli located in region 308 of test program ROMs 207. Step 303 assumes that the IC being exercised contains a microengine or instruction processor capable of executing a programmed sequence of instructions. Further, it assumes that some instruction storage is available internal to the IC being exercised, such as for example a relatively small cache designed for high-speed operation. In step 503, the self-exercise instruction sequence is loaded into the instruction memory or cache internal to the IC being exercised. Nevertheless, if these features are not present in the IC being exercised, then step 303 can be used to provide other test stimuli to exercise the device under test, which presumably would be designed so as to be thoroughly exercisable without a self-exercise sequence.

The duration of step 303 is determined by the value set in load-end switches 205—specifically it is the difference between scan-end switches 204 and load-end switches 205. Test controller 213 transitions from step 303 to step 304 when the address to be presented to test program ROMs 207 equals the value present in load-end switches 205.

In step 304, input-stimuli generator 100 waits while the IC being exercised executes the self-exercise sequence from its instruction memory. The duration of step 304, the wait state, is set directly by the value in wait-duration switches 206.

By choosing appropriate values of switches 404 to 406, step 303, step 304 or both can be omitted when testing an IC that does not contain such an instruction memory, or does not have equivalent capability to exercise its own operation.

The unused region 309 of test program ROMs 207 could be used to store values for the programmability parameters equivalent to the switches 402 to 406, in an embodiment of this invention where any of switches 402 to 407 were replaced by loading the corresponding value from locations within test program ROMs 207. a preferred embodiment, test program ROMs 207 comprises 5 PROMS configured to produce 32K words or test vectors of 40 bits each, a value of approximately 8K is used for scan-end switches 204, a value of approximately 14K is used for load-end switches 205, leaving approximately 10K vectors unused in test program ROMs 207. A value of approximately 30K is used for wait-duration switches 206. These design choices adequately exercise the IC type for which the burn-in controller of the present invention was originally designed for—a Reduced Instruction Set Computer (RISC) processor of approximately 500,000 transistors.

Test Controller

Figure 4:
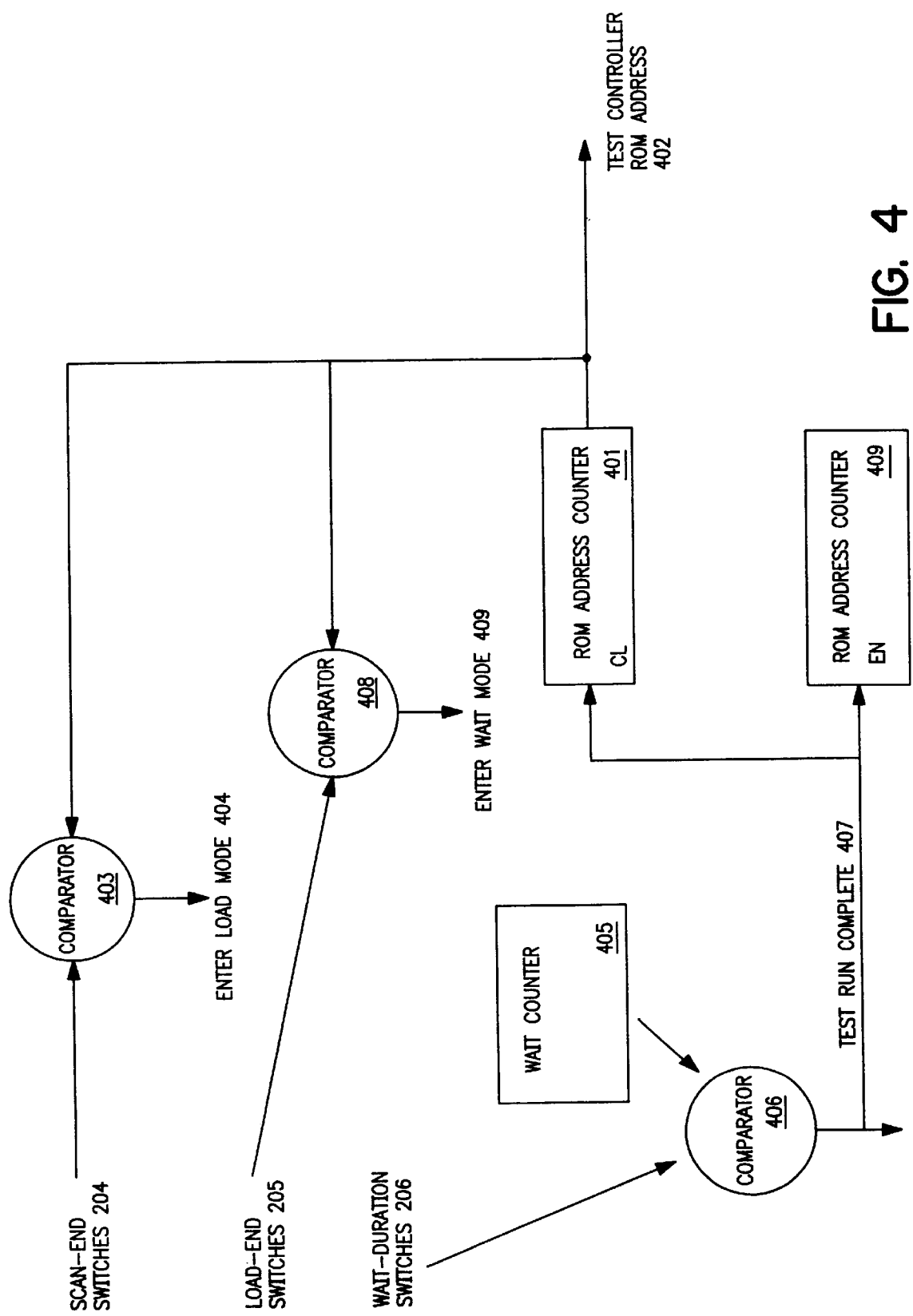
FIG. 4 shows the registers and comparators used in the test controller circuit.

FIG. 4 shows a preferred embodiment for the test controller circuit of the present invention. Burn-in controller 201 comprises more than one identical copy of test controller 213. This replication is key to providing the self test and voting features of the present invention. Each test controller 213 accepts as input a value specified by scan-end switches 204, load-end switches 205 and wait-duration switches 206, preferably with each value being A-bits wide. Each test controller 213 produces as output an A-bit value for test controller ROM address 402 and the control signals enter load mode 404, enter wait mode 409 and test-run complete 407.

"A" is the number of bits required to address test program ROMs 207 for the largest test or exercise program with which burn-in controller 201 is operable. It's exact value is a tradeoff familiar to those skilled in the art—a larger value supports longer test programs but requires more circuitry internal to burn-in controller 201 and larger or additional test program ROMs 207. In a preferred embodiment, a value of 15 was used for A, thus allowing for 32K test vectors.

As was discussed above in reference to FIG. 3, scan-end switches 204 are set to contain the last address within test program ROMs 207 to be used as input stimuli to be applied to input pins of the ICs being exercised during step 302, drive scan loop. Load-end switches 205 are set to contain the last address within test program ROMs 207 to be used as input stimuli to be applied to input pins of the ICs being exercised during step 303, load instruction memory. Wait-duration switches 206 are set to contain the number of clock cycles for which the ICs being exercised is to be left alone to exercise itself according to the test sequence loaded into its instruction memory.

Each test controller 213 outputs an A-bit value for test controller ROM address 402. Preferably, this value does not go directly to test program ROMs 207, though it could in an embodiment of this invention that does not use a voter circuit. Rather it is preferable that fault tolerance circuit 212 generate a more reliable version of the address to be used by test program ROMs 207 by comparing the ROM address 402 output by each copy of test controller 213.

As shown in FIG. 4, each test controller 213 comprises three counters and three comparators. ROM address counter 401 produces an A-bit value suitable for (but preferably not used directly for) addressing test program ROMs 207. Comparator 403 detects that the value of ROM address counter 401 equals the value of scan-end switches 204, and if so, generates the control signal enter load mode 404. Comparator 408 detects that the value of ROM address counter 401 equals the value of load-end switches 205, and if so, generates the control signal enter load wait 409. Comparator 406 detects that the value of wait counter 405 equals the value of wait-duration switches 206, and if so, generates the control signal test-run complete 407, which resets wait counter 405 to zero and increments test-run counter 409.

Figure 5:
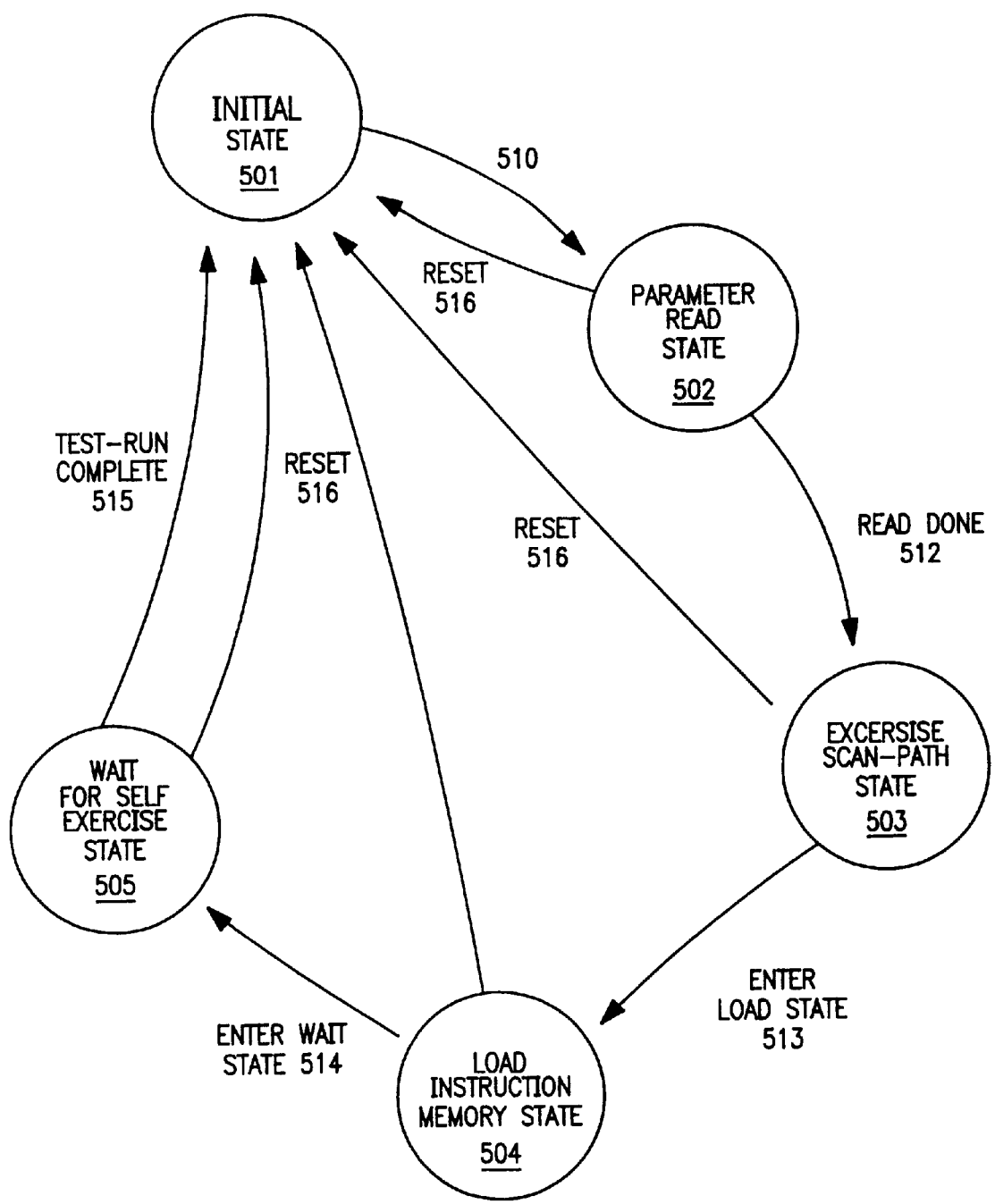
FIG. 5 diagrams the states and state transitions of the operation of the test controller circuit.

FIG. 5 is a state diagram of test controller 213. Power-on/reset controller 210 forces test controller 213 into initial state 501 upon initial power up or receipt of reset signal 214. When fault tolerance circuit 212 detects an error that is serious enough to warrant interrupting the current test run, it forces each test controller 213 into initial state 501 via reset transitions 516, in an attempt to re-synchronize each copy of test controller 213. In normal operation, initial state 501 is entered by state transition 515 when comparator 406 generates the control signal test-run complete 407. On the next clock, initial state 501 transitions into parameter read state 502.

Parameter read state 502 is a design alternative to one or more of switches 202 to 206. As discussed earlier, one or more of the programmability parameters read from these switches can instead be read from specified locations within test program ROMs 207, e.g. by starting at its last address and reading descending addresses.

Exercise scan-path-state 503 is entered via read-done state transition 512 at the conclusion of parameter read state 502—or immediately after initial state 501 if no programmability parameters are read from test program ROMs 207. Exercise scan-path state 503 corresponds to steps 301 and 302, reset IC being exercised and drive scan loop, in FIG. 3(*a*). This state corresponds to regions 306 and 307, reset vector(s) and scan-path input stimuli, within test program ROMs 207, as shown in FIG. 3(*b*). The normal transition from this state occurs when the control signal enter load mode 404 causes state transition 513 into load instruction-memory state 504.

Load instruction-memory state 504 corresponds to step 303, load instruction memory, and to ROM region 308, instruction memory load stimuli, as shown in FIG. 3. The normal transition from this state occurs when the control signal enter wait mode 409 causes state transition 514 into wait for self-exercise state 505.

During wait for self-exercise state 505, burn-in controller 201 increments wait counter 405 and compares its current value with wait-duration switches 206 to generate the control signal test-run complete 407. When this occurs, test controller 213 makes state transition 515 into initial state 501.

Each test controller 213 produces its version of the control signals enter load mode 404, enter wait mode 409 and test-run complete 407. As with ROM address 402, preferably these signals are not used directly, but are first compared across each copy of test controller 213 by fault tolerance circuit 212.

These control signals may be used by burn-in controller 201 to alter the timing of or the input stimuli applied to the ICs being exercised in these different modes. In a preferred embodiment, they are used to switch between advancing to the next test vector every third clock cycle in exercise scan-path state 503 and advancing to the next test vector every clock cycle in load instruction-memory state 509. That, is ROM address counter 401 is incremented each clock cycle in state 509 and every third clock cycle in state 503, It is reset by the control signal test-run complete 407.

Fault Tolerance Circuit

Fault tolerance circuit 212 provides the voting and/or self-test features preferred to ensure the proper operation of input stimuli generator 100 in the environmental stress within burn-in chamber 101. The present invention comprehends a range of design alternatives for fault tolerance circuit 212. Depending on the degree of safety desired and the circuit cost and complexity affordable, voting features can be emphasized, or self-test features can be emphasized, or both can be provided.

Raising the temperature, and sometimes the humidity, in which an IC being exercised operates is key to accelerating its aging. The heat is usually generated from an electrical source located within or surrounding burn-in chamber 101. Fans are often used to help keep the temperature and humidity uniform. These fans and heat sources are usually turned on and off homeostaticly. Each transition from on to off, or from off to on, the running of the fan motors, and alternating current passing through heating coils can create electromagnetic transients within burn-in chamber 101. These electromagnetic transients can momentarily disrupt the correct operation of the circuitry within input-stimuli generator 100, i.e. of burn-in controller 201, test program ROMs 207 and buffers 209. Thus, it is desirable that input stimuli generator 100 feature a tolerance for transient-induced errors.

Preferably, detection of hard or repeating errors is provided simultaneously with transient-error tolerance. Because input stimuli generator 100 is under environmental stress, its circuits age more rapidly than normal. To counter this, it preferably is supplied with nominal power levels, rather than the higher stress power. Also, input stimuli generator 100 preferably is designed and fabricated so as to be operable under the environmental stress within burn-in chamber 101 for a sustained period of time, say thousands of times longer than a typical burn-in period. Nevertheless, detection of hard errors is preferred in a circuit operated under environmental stress.

The voting features of fault tolerance circuit 212 provide the ability to continue to generate the programmed input-stimuli sequence despite the occurrence of either transient errors or hard (repeatable) errors. The voting circuits constantly compare the outputs of each copy of test controller 213 and pass on for action the majority vote, or the prevalent value. They preferably comprise an A-bit-wide voter to produce ROM address 414, and single-bit voters to produce the control signals enter-load mode 404, enter-wait mode 409 and test-run complete 406. A preferred embodiment uses three copies of test controller 213 and performs the A-bit-wide voting on a bit-by-bit basis, thus ensuring there is always a majority value. Alternative voting schemes are known in the art (such as word-wide voting comparisons) and may be employed without departing from the spirit and scope of this invention.

The self-test features of fault tolerance circuit 212 compare the outputs of each test controller 213. The self-test circuits preferably comprise an A-bit-wide comparator for test controller ROM address 402, and single-bit comparators for the signals enter-load mode 404, enter-wait mode 409 and test-run complete 407. A preferred embodiment considers any difference at all significant—if all copies of test controller 213 do not agree completely, then error-detected signal 220 is generated. Alternative self-test schemes (such as tolerating one copy that disagrees) are known in the art and may be employed without departing from the spirit and scope of the invention.

Figure 6:
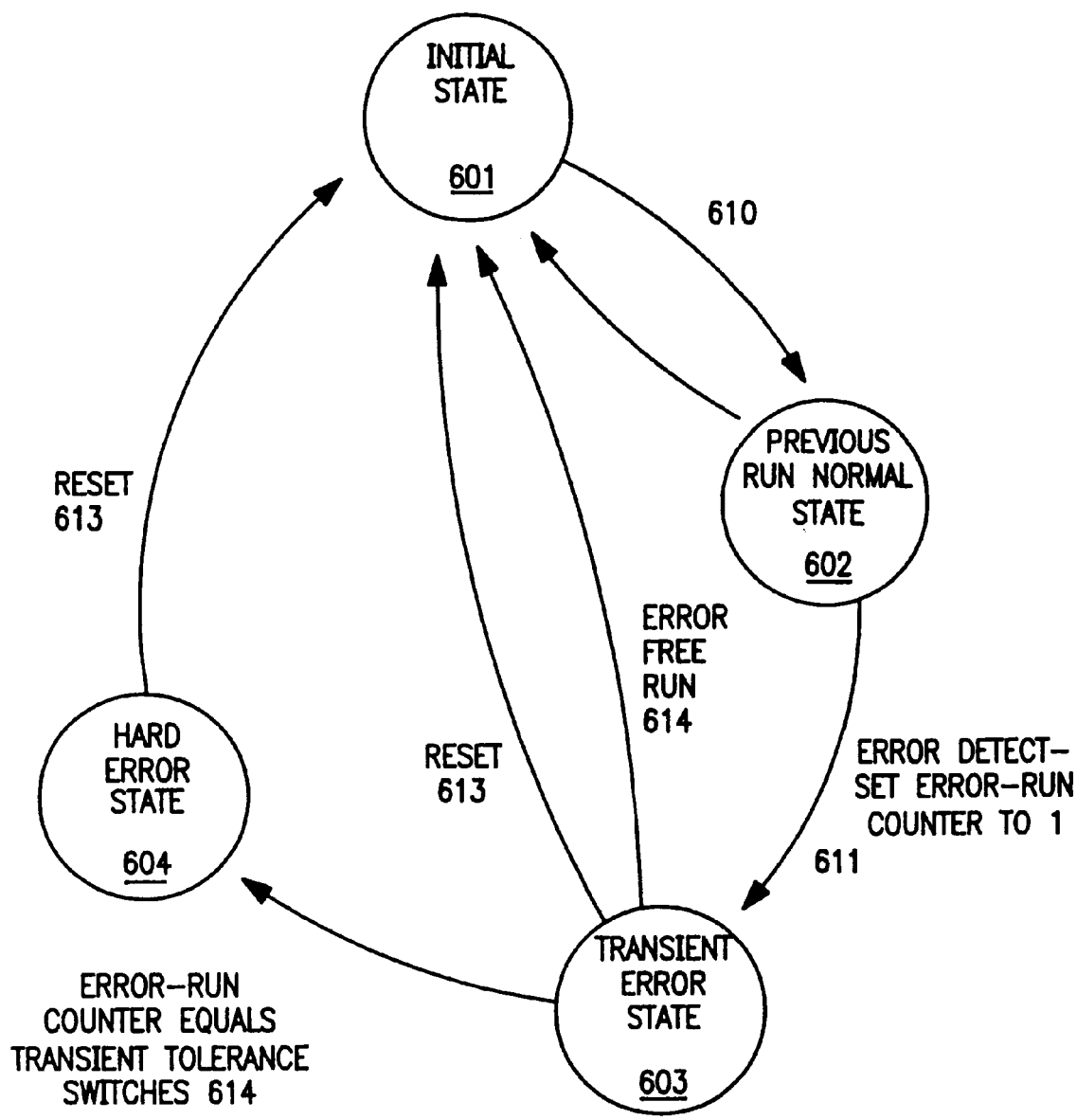
FIG. 6 is a state and state-transition diagram describing the operation of the voting/self test circuit.

FIG. 6 is a state diagram of the self-test circuit of fault tolerance circuit 212. It shows how both transient tolerance and hard-error detection is achieved. The copies of test controller 213 may disagree among themselves for a programmable period of time before a hard error is detected. By adjusting this time period to be longer than the duration of the longest electromagnetic transient likely to occur within burn-in chamber 101, temporary errors induced by electromagnetic transients can be distinguished from repeating failures of the circuits within input stimuli generator 100.

Power-on/reset controller 210 initially forces the self-test circuit into initial state 601. The self-test circuit then enters previous-run-normal state 602 via transition 610. It remains in this state until and unless an error is detected, at which time it enters transient-error state 603 via transition 611 and sets a one into the error-run counter (not shown). The error-run counter contains the number of previous runs during which an error was detected. If an error is detected during any test run while the circuit is in transient error state 603, then the value in error-run counter is incremented. If a test run is completed without detecting any errors, then run-error counter is cleared to zero and the self-test circuit enters initial state 601 via transition 614.

If the value of the error-run counter equals the programmable threshold read from transient tolerance switches 203, then the self-test circuit enters hard-error state 604 via transition 612. The only exit from this state is via reset transition 613, that is via operator intervention. Preferably hard-error state 601 signals the operator of the burn-in system via a visual indicator, such as a Light Emitting Diode (LED) on the printed circuit board on which burn-in controller 201 is located. Alternatively, an error signal may be routed to logging or alarm devices external to burn-in chamber 101.

While in hard-error state 604, the self-test circuit preferably "safes" the ICs being exercised. That it, it forces all zeros onto ROM address 214, which addresses the reset stimuli vector within test program ROMs 207, which provides a constant reset command to each IC being exercised. This helps prevent any damage to the ICs being exercised from improper operation of burn-in controller 201.

Depending on the relative emphasis on fault tolerance versus self test, the self-test circuit may or may not reset each test controller 213 whenever an error is detected. In a preferred embodiment, whenever the self-test circuit detects any disagreement at all among each copy of test controller 213, it triggers an immediate reset of all three test-controllers. Alternative reset schemes for fault tolerance are known in the art and may be employed without departing from the spirit and scope of this invention.

Applications of the Burn-In System

Figure 7:
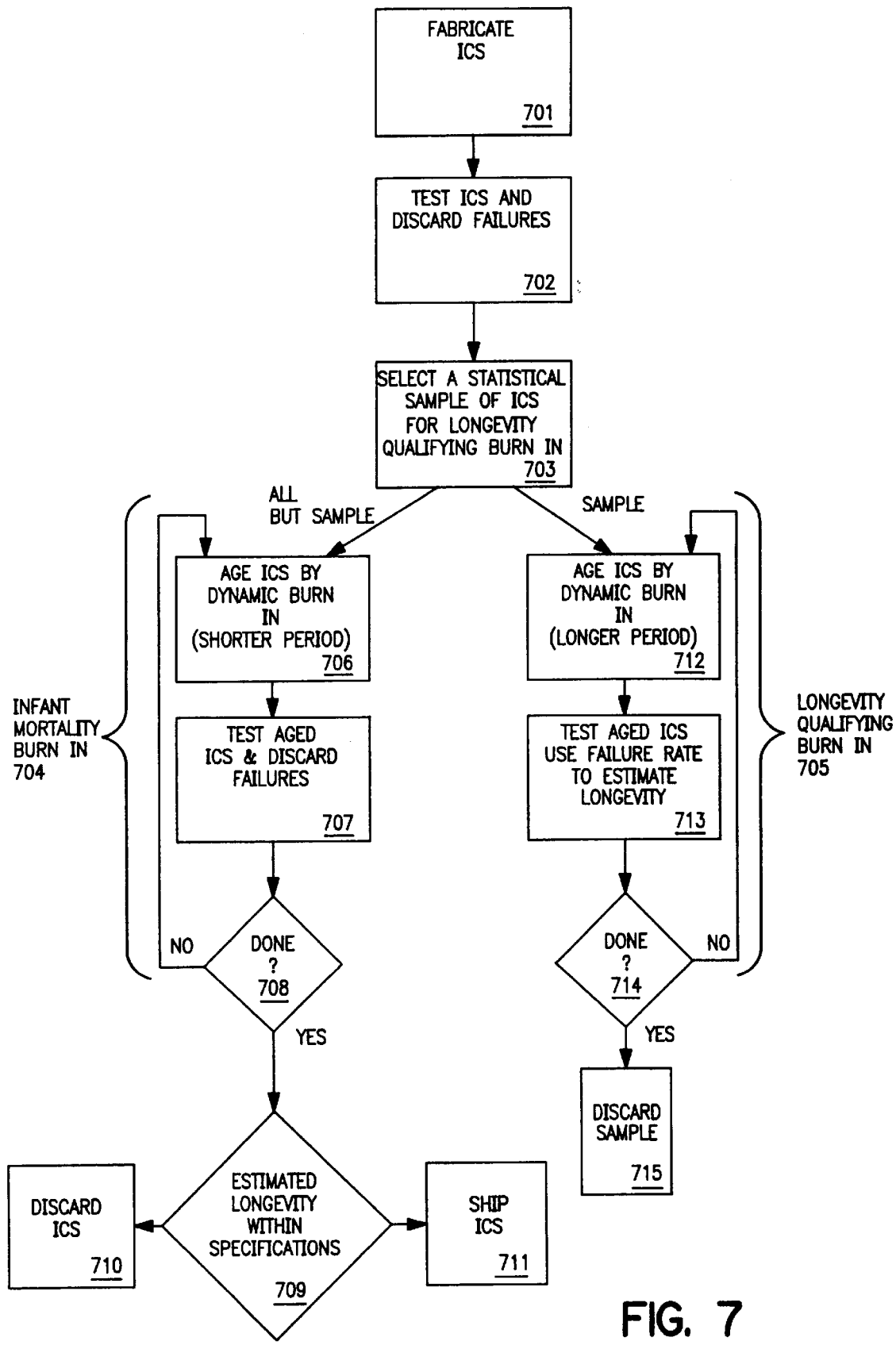
FIG. 7 shows two ways in which the burn-in system can be used to ensure the quality of ICs after they are manufactured.

FIG. 7 illustrates how the burn-in system of the present invention can be used to improve the quality and reliability of integrated circuits in two ways: infant-mortality burn in 704 and longevity-qualification burn in 705.

In step 701, a batch of ICs are manufactured. In step 702, each IC is individually tested for correct functionality. Typically, this is done at full speed and at more than one voltage and/or temperature level. Non-functional ICs are discarded. In step 703, if longevity-qualification burn in is to be performed on this batch, then a statistically significant sample is selected from it for longevity-qualification burn in.

Infant-mortality burn in 704 aims to reduce or prevent early failures of ICs in the field, as discussed above. If an IC is still operational after a relatively short time of being exercised under stress conditions, then it is not likely to fail early in field use under normal conditions. Infant-mortality burn in 704 comprises the following:

In step 706, all ICs in the batch are aged using the input-stimuli generator of the present invention to ensure that the electrical nodes within the IC change state repeatedly during the burn-in process so as to maximize aging effects. Infant-mortality burn in times on the order of one hour are not unusual. The goal is a test that is long enough to capture essentially all "weak sisters", but short enough not to unduly tie up expensive burn-in equipment and operator time.

The duration and stress levels suitable for use in this step 706 are known in the art or are obtainable by experimentation. This experimentation can be conducted by repeatedly cycling ICs through an infant-mortality burn in cycle until the failure rate in each cycle drops off—thus indicating that all weak sisters have been weeded out. Also, it is important that infant-mortality burn in not significantly decrease the longevity of the ICs that go through it. This can be ensured experimentally by subjecting a sample of ICs that went through infant mortality burn in to longevity-qualification burn in.

After being aged in step 706, each IC is again tested for proper functionality in step 707. Again, it is preferable to perform these functionality tests at full speed, and under multiple temperature and voltage conditions. ICs that fail are discarded. Preferably the number of failures is tracked across IC fabrication batches to help identify any manufacturing problems. As shown in step 708, it may be desired to repeat steps 706 and 707, e.g. for experimentation or process-monitoring purposes.

Longevity-qualification burn-in 705 aims to ensure that ICs have the longevity expected in field use. By taking a statistically representative sample of a batch of ICs, and exercising them under stress conditions until they start to fail, the longevity of that batch in normal field use can be estimated. Because of the aging effects they undergo, the ICs used in longevity-qualification burn in are not actually sold. Longevity-qualification burn-in 705 comprises the following:

In step 712, all ICs in the statistical sample are aged using the input-stimuli generator of the present invention to ensure that the electrical nodes within the IC change state repeatedly during the burn-in process so as to maximize aging effects. Test times on the order of one week of constant burn in are not unusual. The duration and stress levels suitable for use in this step are known in the art or are obtainable by experimentation. Preferably, the test is short enough not to unduly tie up expensive burn-in equipment and operator time. The goal is a test that is long enough to reveal any ICs that, based on the accelerated aging, would be expected to fail before the specified lifetime of the IC. Experimentation can be conducted by repeatedly cycling ICs through a longevity-qualification burn in cycle until the failure rate in each cycle starts to rise—thus indicating that the ICs are starting to fail from aging effects.

After being aged in step 712, each IC is tested for proper functionality in step 713. Again, it is preferable to perform these functionality tests at full speed, and under multiple temperature and voltage conditions. The number of ICs that fail is measured. This measurement is extrapolated to obtain an estimate of the expected longevity of the ICs in the batch sampled. As shown in step 714, it may be desired to repeat steps 712 and 713, e.g. for experimentation or process-monitoring purposes.

ICs subjected to the aging effects of longevity-qualification burn-in are not used in the field. Step 715 shows them being discarded, though they may first be subjected to failure analysis to determine why they failed.

Steps 709, 710 and 711 illustrate applying the results of longevity-qualification burn in. If the expected longevity of an IC batch is not within specifications, then reputable IC manufactures would not ship any ICs from that batch. A borderline value for expected longevity may result in a batch that is shipped, plus an active investigation of what may be causing the reduced longevity. Burn-in test results must be reliable because they drive important decisions that potentially effect millions of dollars of discarded work-in-process and manufacturing down time.

Advantages of the Burn-In System

As has been shown above, the present invention provides its users with significant advantages:

(a) The burn-in system of the present invention can generate thorough input stimuli that exercise a very high percentage of the nodes within the ICs being exercised.

(b) It is fully programmable to be adaptable to various designs of ICs being exercised.

(c) The above advantages are achieved at a cost and complexity comparable to that of a static burn-in oven, even though the burn-in oven of this invention has a high node-toggle percentage comparable to that of a static burn-in oven.

(d) To accommodate being placed within the burn-in chamber, the present invention provides substantial fault tolerance, preferably including being fabricated using an IC technology that is more robust than that of the ICs being exercised, continuously operating built-in self-test and/or voting features, which allow the testing to proceed as normal even when portions of the system fail.

(e) To further increase node toggling during the burn-in process, the present invention preferably presents to the ICs being exercised input stimuli that cause it to load internal instruction memory with a self-exercise program sequence, and waits while it executes.

While the preferred embodiment of this invention and various design alternatives are disclosed:and described in detail herein, it will be obvious to those skilled in the art that various changes in form and detail may be made without departing from the spirit and scope of the present invention.

I claim:

1. A method of manufacturing a batch of integrated circuits (ICs), comprising:
    (a) fabricating a batch of ICs;
    (b) testing said batch and discarding therefrom any non-functional ICs;
    (c) selecting a predetermined number of ICs from said batch;
    (d) exercising said selected ICs in a burn-in chamber, said burn-in chamber operable to subject said selected ICs to environmental stress, and said burn-in chamber having within it an input-stimuli generator to generate a programmable input-stimuli sequence, said input-stimuli sequence being coupled to input pins of each of said selected ICs; and
    (e) testing said selected ICs to determine a failure rate, whereby said failure rate is indicative of the longevity of the ICs in said batch.

2. The method of claim 1, wherein said selected ICs are powered at a stress voltage and said input-stimuli generator is powered at a nominal voltage.

3. The method of claim 1, wherein said input-stimuli generator is operable, during periods of its partial failure, to attempt to generate said input-stimuli sequence.

4. The method of claim 1, wherein said input-stimuli generator is operable for sustained periods under said environmental stress.

5. A method of manufacturing a batch of integrated circuits (ICs), comprising:
    (a) fabricating a batch of ICs;
    (b) testing said batch and discarding therefrom any non-functional ICs;
    (c) exercising said batch in a burn-in chamber, said burn-in chamber operable to subject the ICs being exercised to environmental stress, said burn-in chamber having within it an input-stimuli generator to generate a programmable input-stimuli sequence, said input-stimuli sequence being coupled to input pins of each IC being exercised; and
    (d) testing said batch and discarding therefrom any non-functional ICs, whereby infant mortality in said batch is reduced.

6. The method of claim 5, wherein said ICs being exercised are powered at a stress voltage and said input-stimuli generator is powered at a nominal voltage.

7. The method of claim 5, wherein said input-stimuli generator is operable, during periods of its partial failure, to attempt to generate said input-stimuli sequence.

8. The method of claim 5, wherein said input-stimuli generator is operable for sustained periods under said environmental stress.

9. A method of exercising an integrated circuit (IC) having an instruction memory, comprising:
    (a) placing an IC under environmental stress within a burn-in chamber;
    (b) applying to input pins of said IC input stimuli, generated by an input-stimuli generator located within said burn-in chamber, to load a self-exercise sequence into instruction memory within said IC; and
    (c) enabling said IC to execute said self-exercise sequence.

10. The method of claim 9, wherein said IC is powered at a stress voltage and said input-stimuli generator is powered at a nominal voltage.

11. The method of claim 9, wherein said input-stimuli generator is operable, during periods of its partial failure, to attempt to generate said input-stimuli sequence.

12. The method of claim 9, wherein said input-stimuli generator is operable for sustained periods under said environmental stress.

13. A burn-in controller, comprising:
    (a) a plurality of identical test controllers, each operable to generate signals to control the application of input stimuli to an integrated circuit (IC); and
    (b) a fault-tolerance circuit operable to compare said signals generated by said plurality of test controllers.

14. The burn-in controller of claim 13, wherein said fault-tolerance circuit comprises a self-test circuit operable to detect, based on said comparison, an error if each of said plurality of test controllers is not functioning in the same manner.

15. The burn-in controller of claim 14, wherein said self-test circuit is operable in:
    (a) a previous-run-normal state, indicating that said self-test circuit did not detect any error during the test run immediately preceding the current test run;
    (b) a transient-error state having an associated error-run counter, indicating that for each of the preceding test runs counted by said error-run counter said self-test circuit detected an error during that test run, said error-run counter incrementing for each test run during which said self-test circuit detects an error; and
    (c) a hard-error state, indicating that said error-run counter exceeded a hard-error threshold;
    said previous-run-normal state transitioning to said transient error state when said self test circuit detects an error, said transient-error state transitioning to said previous-run-normal state upon completion of a test run during which said self-test circuit does not detect any error, and said transient-error state transitioning to said hard error state when said error-run counter exceeds said hard-error threshold.

16. The burn-in controller of claim 15, wherein when said hard-error state is entered, said signals to control the application of input stimuli to said IC cause a safe input stimuli to be coupled to said IC.

17. The burn-in controller of claim 13, wherein said fault-tolerant circuit comprises a voting circuit operable to select, based on said comparison, the values of said generated signals that are most prevalent and operable to control the application of input stimuli to said IC based on said selected signal values.

18. The burn-in controller of claim 13, wherein each said test controller is operable in a load-instruction-memory state and a wait-for-self-exercise state, the former to load a programmable self-exercise instruction sequence into instruction memory within said IC, and the later to wait while said IC executes said self-exercise instruction sequence.

19. The burn-in controller of claim 13, further comprising a power and clock generator to generate power and a clock signal, said clock generator being coupled to said IC so as to provide thereto said power and said clock signal.

20. A method of providing an integrated circuit (IC) burn-in system, comprising:
    providing an IC burn-in system, said system comprising:
        (a) a plurality of identical test controllers, each operable to generate signals to control the application of input stimuli to an IC; and
        (b) a self-test circuit operable to compare said signals generated by said plurality of test controllers and to detect, based on said comparison, an error if each of said plurality of test controllers is not functioning in the same manner, said self-test circuit being operable in:
- (1) a previous-run-normal state, indicative that said self-test circuit did not detect any error during the test run immediately preceding the current test run; and
- (2) a transient-error state having an associated error-run counter, indicating that for each of the preceding test runs counted by said error-run counter said self-test circuit detected an error during that test run, said error-run counter incrementing for each test run during which said self-test circuit detects an error; and
- (3) a hard-error state, indicating that said error-run counter exceeded a hard-error threshold;

said previous-run-normal state transitioning to said transient error state when said self-test circuit detects an error, and said transient-error state transitioning to said previous-run-normal state upon completion of a test run during which said self-test circuit does not detect any error; and said transient-error state transitioning to said hard error state when said error-run counter exceeds said hard-error threshold.

21. The method of claim 20, said IC burn-in system further comprising a burn-in chamber operable to subject its contents to environmental stress, said burn-in chamber containing said ICs being exercised, said plurality of test controllers and said self-test circuit.

22. A method of providing an integrated circuit (IC) burn-in system, comprising:

providing an IC burn-in system comprising:
- (a) a burn-in chamber operable to subject an IC being exercised located within it to environmental stress; and
- (b) a plurality of identical test controllers, located within said burn-in chamber, operable to generate signals to control the application of input stimuli to an IC; and
- (c) a voting circuit, located within said burn-in chamber, operable to select, based on comparing said signals generated by said plurality of test controllers, the values of said generated signals that are most prevalent, and operable to control the application of input stimuli to said IC based on said selected signal values.

* * * * *